Jan. 1, 1974 T. J. SANDERS 3,783,048

HIGH FREQUENCY TRANSISTOR FABRICATION

Filed March 22, 1972

United States Patent Office
3,783,048
Patented Jan. 1, 1974

3,783,048

HIGH FREQUENCY TRANSISTOR FABRICATION

Thomas J. Sanders, Indialantic, Fla., assignor to Harris-Intertype Corporation

Filed Mar. 22, 1972, Ser. No. 236,809
Int. Cl. H01l 7/44
U.S. Cl. 148—187 2 Claims

ABSTRACT OF THE DISCLOSURE

In the fabrication of high frequency NPN transistors in integrated circuits, a doped oxide layer is formed on the surface of the wafer after diffusion of the base region and prior to opening the emitter diffusion window. Thereafter, removal of oxide regrown in the emitter diffusion window to form an emitter contact window, and simultaneous removal of other surface oxide concurrently grown therewith, leaves intact the doped oxide layer to prevent surface inversion.

BACKGROUND OF THE INVENTION

Field

The present invention pertains to the fabrication of high frequency NPN transistors in integrated circuits, using a process which prevents surface inversion.

Prior art

In the fabrication of high frequency transistors within a substantially monolithic substrate, as in the production of integrated circuits, it is customary to perform an acid etch to remove the oxide which forms in the emitter window (i.e., the aperture exposing the semiconductor surface) during the emitter diffusion step. The removal of such oxide is necessary to provide a wash emitter (i.e., an emitter contact window) which will allow the formation of an emitter contact during the normal metallization procedure.

Unless a selective etch process is performed, the oxide removal step affects the entire oxide passivation layer contacted by the etchant. Selective etch procedures are expensive since they require additional process steps. Normally, oxide removal for making wash emitters is ac complished using a non-selective etch or deglaze, such as HF in the case of $SiO_2$. In a typical process involving the fabrication of high frequency transistors in a silicon wafer or in silicon islands, an HF deglaze removes a substantial portion of the phosphorus doped oxide on the surface of the integrated circuit thereby seriously reducing surface passivation. Under those conditions further high temperature processing such as is encountered in bias stress life tests can cause base surface inversion.

SUMMARY OF THE INVENTION

It is a principal object of the invention to prevent surface inversion in high frequency NPN transistors when generally following the prior art fabrication processes.

Briefly, this desirable object is achieved in accordance with the present invention by a buildup of phosphorus doped silicon dioxide over the entire surface prior to formation of the wash emitter. The buildup of oxide may be performed by thermal growth or by vapor deposition using conventional techniques. Subsequent wash emitter processing then removes phosphorus doped $SiO_2$ from the emitter contact aperture but leaves a substantial passivation layer over the remainder of the surface, thereby precluding any significant surface inversion.

DETAILED DESCRIPTION

Figure 1:
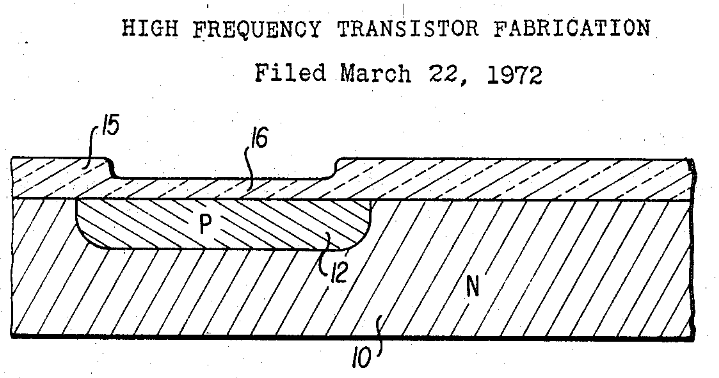
FIGS. 1–5 are fragmentary sectional views of a semiconductor body at typical stages in the processing sequence of the invention.

Referring to FIG. 1, an N-type silicon body 10 forms the collector region for a high frequency NPN transistor to be fabricated as a component of a larger integrated circuit. A base region 12 is formed by diffusing P-type impurities through a window 13 in an oxide (typically $SiO_2$) layer 15. During the high temperature diffusion process a thinner layer 16 of oxide is grown over the silicon surface which had been exposed by window 13.

Figure 2:
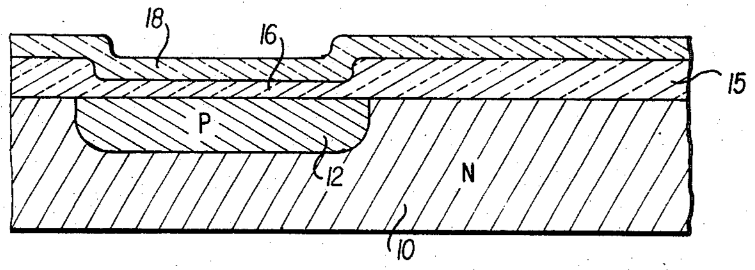

A relatively thick layer 18 of phosphorus doped silicon dioxide is now built up over the entire exposed surface as shown in FIG. 2. This build-up may be accomplished by thermal growth in an atmosphere containing phosphorus atoms, or by depositing $SiO_2$ together with phosphorus atoms. Oxide layer 18 need only be a few thousand angstroms thick, preferably less than 20,000 A.

Figure 3:
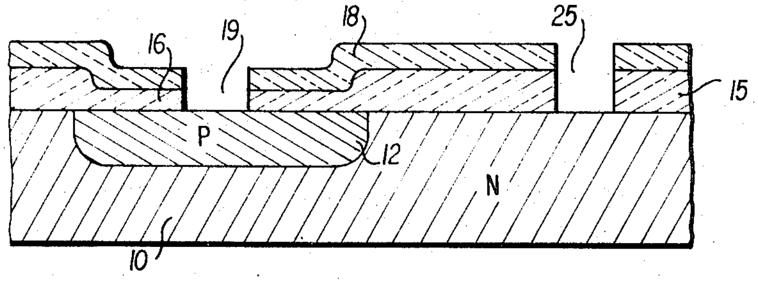

Now, an emitter diffusion window 19 is opened by selective etching (e.g., using photoresist and standard photolithographic techniques to define the aperature location prior to etching) as shown in FIG. 3. As a consequence of the selective etch process, the oxide layer 18 is left substantially intact except where the window is formed.

During the emitter diffusion step, in which phosphorus is typically used as the donor impurity, an N type emitter region 20 (FIG. 4) is formed beneath the window 19. Since diffusion occurs in every direction within base region 12 the emitter region 20 ultimately extends beyond the sides of window 19, beneath oxide layer 15. As a consequence of the high temperature phosphorus diffusion process, the acceptor impurities previously diffused to form base region 12 diffuse further into silicon body 10, and a phosphorus doped silicon dioxide layer 22 is grown on the silicon surface in window 19 and over the remaining exposed surface including the previously applied oxide layers.

Figure 5:
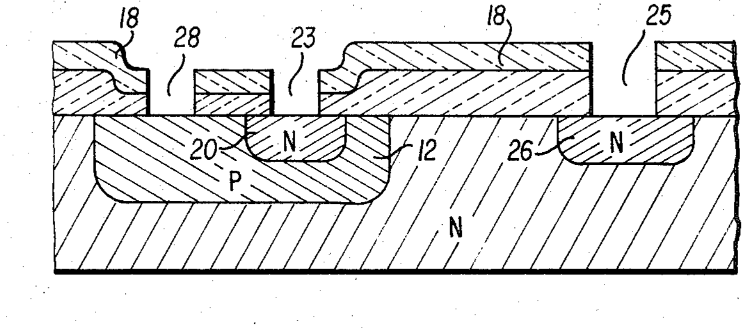

By virtue of the composition and thinness of oxide layer 22 in window 19 a simple and rapid HF etch wash (deglaze) is sufficient to reopen the window (as shown in FIG. 5) to permit application of the emitter contact. Moreover, this wash emitter 23 (i.e., emitter contact window) which is essentially window 19 is substantially smaller than the surface of emitter region 20 because of the aforementioned lateral diffusion, and is therefore ideally sized for an emitter contact. Now although the HF deglaze also substantially removes the remainder of oxide layer 22 (beyond that which had been confined in window 19) the previously built-up phosphorus doped $SiO_2$ layer 18 is left to prevent loss of passivation and consequent surface inversion.

Figure 4:
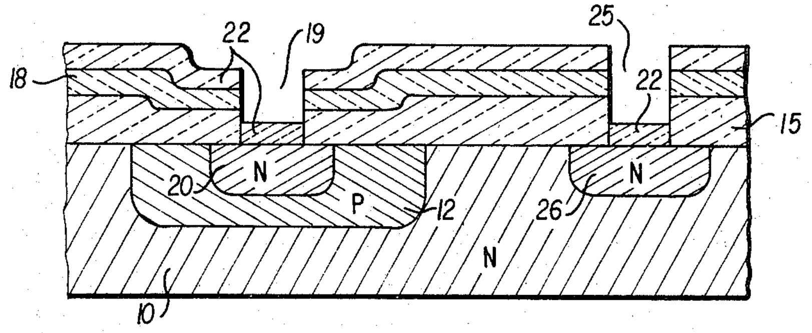

A collector contact diffusion window 25 (FIG. 3) may conveniently be opened in the oxide layers prior to emitter diffusion, to permit simultaneous diffusion of the emitter region 20 and a collector contact region 26 (FIG. 4). The oxide layer 22 that forms in window 25 during the diffusion process is removed concurrently with the rest of layer 22 by the HF deglaze.

A base contact window 28 (FIG. 5) may now be selectively opened for each transistor.

What is claimed is:

1. The process of fabricating a high frequency NPN transistor in an N-type silicon body, which comprises diffusing an acceptor impurity through a window in an oxide layer atop a major surface of the silicon body to form a P-type base region therein, forming a doped second oxide layer on the first oxide layer and on the oxide regrown in said window during said diffusion to provide surface passivation, opening a second window of smaller dimension through said second oxide layer and said regrown oxide within the periphery of the first window to expose a portion of said major surface above said base region, diffusing a donor impurity through the second window to form an N-type emitter region within said base region, and non-selectively etching the oxide regrown in said second window during the donor impurity diffusion step to provide an emitter contact window, and concurrently substantially removing exposed surface oxide grown therewith while leaving said second oxide layer substantially intact to prevent surface inversion at said base region.

2. The process according to claim 1, wherein said donor impurity is phosphorus, and said second oxide layer is phosphorus doped silicon dioxide.

References Cited

UNITED STATES PATENTS

| | | | |
|---|---|---|---|
| 3,650,854 | 3/1972 | Demsky et al. | 148—187 |
| 3,497,407 | 2/1970 | Esch et al. | 156—17 |
| 3,394,037 | 7/1968 | Robinson | 148—187 |
| 3,476,619 | 11/1969 | Tolliver | 148—187 |
| 3,489,622 | 1/1970 | Barson et al. | 148—187 |
| 3,507,716 | 4/1970 | Nishida et al. | 148—187 |

CHARLES N. LOVELL, Primary Examiner

J. M. DAVIS, Assistant Examiner

U.S. Cl. X.R.

148—189